United States Patent [19]

Meyer et al.

[11] 4,283,702
[45] Aug. 11, 1981

[54] CONTACTLESS CONDUCTANCE POTENTIOMETER

[75] Inventors: Juergen Meyer, Taunusstein, German Democratic Rep.; Norbert Schaaf, Wiesbaden, Fed. Rep. of Germany

[73] Assignee: Heimann GmbH, Wiesbaden, Fed. Rep. of Germany

[21] Appl. No.: 37,825

[22] Filed: May 10, 1979

[30] Foreign Application Priority Data

May 23, 1978 [DE] Fed. Rep. of Germany ....... 2822502

[51] Int. Cl.³ ............................................ H01L 31/08
[52] U.S. Cl. .................................. 338/15; 250/211 K
[58] Field of Search ...................... 338/15; 250/211 K; 73/355 R; 252/501; 29/572; 356/213; 136/89 R, 89 AC, 89 CK

[56] References Cited

U.S. PATENT DOCUMENTS

| 3,222,531 | 12/1965 | Morrison | 250/211 K |
| 3,258,601 | 6/1966 | Suleski | 250/211 K |

FOREIGN PATENT DOCUMENTS

| 697332 | 11/1964 | Canada | 338/15 |
| 2386111 | 12/1978 | France | 338/15 |

Primary Examiner—C. L. Albritton
Attorney, Agent, or Firm—Hill, Van Santen, Steadman, Chiara & Simpson

[57] ABSTRACT

A contactless conductance potentiometer is provided in which the total conductance between two electric terminals can be selectively divided, the two parts being equal to the total conductance. This can be accomplished by using a ring-shaped photoconductor on a substrate, the ring-shaped photoconductor being divided along a diametral line. One exterior electrode is located on the substrate in a position surrounding one portion of the ring-shaped photoconductor and being in contact with the marginal edge thereof. The remaining part of the ring-shaped photoconductor is in marginal contact with the second exterior electrode. A tapping electrode is mounted inside the ring-shaped photoconductor and is in marginal contact with the inner edge of the ring-shaped photoconductor. The construction is such that when the photoconductor is exposed to light falling on the combined ring-shaped parts, current will flow through the exposed part of the photoconductor between the tapping electrode and one of the two exterior electrodes.

10 Claims, 7 Drawing Figures

CdS

Jn

CONTACTLESS CONDUCTANCE POTENTIOMETER

BACKGROUND OF THE INVENTION

The invention relates to a contactless conductance potentiometer having two exterior electrodes and a tap for dividing the conductance.

Classic potentiometers consist of an ohmic resistance element formed by a coiled wire or of an extended resistance wire or of a resistance path. The element has two electric connections at the exterior and therebetween a movable sliding contact as the tapping electrode. The sliding contact is activated either via a sliding device or via a rotary device. If one applies a voltage to the exterior electrodes, the tap divides this voltage according to its position on the resistor path. The partial voltages are proportional to the resistance parts lying between tap and exterior electrodes. The total ohmic resistance remains thereby always the same.

If one does not wish to divide a voltage, but rather an electric current, one must divide a conductance which maintains the same in the sum. For this purpose, the classic potentiometer with the linear proportional resistance division is not suited. The sum of the conductance values is not constant. One must divide a resistance path such that a linear proportional conductance division is carried out with the tapping motion.

Independent from this differentiation of a resistance division and a conductance division, classic potentiometers have the disadvantage that noise is caused by the sliding contact and that the life span is delimited by the wear and tear of the contact.

The tap can be designed without contact in order to prevent this. Either the sliding contact is replaced by a different type of contacting means, for example, by exposing the desired tap location in a photoconductor rail which then produces the connection of the point in the resistance- or conductance-value element, corresponding with the point to be contacted, with the tapping electrode, or one alters the resistance value of two partial elements with a fixed tap connection by means of exterior influence, for example, by means of a magnetic field in magnetic field-dependent resistance elements.

In the first case, the disadvantage exists that the activated portion of the photoconductor layer which produces the contact to the tapping electrode has itself a resistance value. In the second case, linearity is difficult to produce, in particular, when an electronic circuit connected to the subjective divider arrangement is required in order to divide the desired electric magnitude.

SUMMARY OF THE INVENTION

The present invention has the underlying objective to provide a conductance potentiometer which has no galvanic tapping contact and which can be accurately linear without great technical expense.

In order to obtain this objective in a potentiometer of the initially mentioned type, it is inventively suggested that a photoconductor layer be used as a conductance element, that this photoconductor layer be circularly delimited by means of contacting and be diametrally subdivided into two halves which are semicircularly contacted with a concentric fixed tapping electrode, on the one hand, and which are respectively semicircularly contacted with one of two exterior electrodes concentric relative to the photoconductor layer, on the other hand, and that a diametral half of the semicircularly delimited photoconductor layer, which is independent from the diametral subdivision, be electrically activated by means of exposure, whereby the setting of the conductance division proceeds by means of concentric twisting of the exposed halves towards the diametral subdivision of the photoconductor layer.

Two basic embodiments are possible. In accordance with one, the current paths proceed essentially radially through the conductance layer. The photoconductor layer then consists of two circular ring halves, essentially, which lie in radial direction between a circularly delimited tapping electrode and two exterior electrodes which are essentially semicircularly delimited at least at the contact point.

In accordance with the one embodiment, the current paths proceed essentially axially through the conductance layer. There, the photoconductor layer lies in an axial direction between the tapping electrode, on one hand, and two exterior electrodes, on the other hand, whereby the contact surfaces to the tapping electrode and to the exterior electrodes essentially consist of semicircular surfaces or at least essentially semicircular ring surfaces. This embodiment is less ohmic than the first.

Accurate linearity of the conductance potentiometer is assured in both embodiments. The total conductance is independent of the rotary angle of the potentiometer. The partial conductances are linearly linked to the rotary angle.

Two advantageous embodiments relate to the exposure. So the photoconductor layer is evenly exposed over the total half, the exposure proceeds via a cone-shaped light conductor which can be coaxially rotated relative to the photoconductor layer, the light conductor in whose tip a light source is located and whose circular base surface is light-impermeable in one diametral half.

According to the other embodiment, the exposure of the photoconductor half proceeds via a cone-shaped photoconductor coaxially arranged relative to the photoconductor layer, said photoconductor in whose tip a light source is situated, whereby a coaxially rotatable diaphragm between photoconductor and photoconductor layer determines the half of the photoconductor layer to be exposed.

In accordance with an additional advantageous embodiment, the cone-shaped photoconductor consists of acrylic glass with an apex angle of $\leq 23°$. A light source, in particular, a luminous diode, is inserted in the tip of the cone. The light is utilized to a maximum extent by means of total reflection at the cone-shaped shell surface.

Additional details result with the aid of the following description of sample embodiments.

DESCRIPTION OF PREFERRED EMBODIMENTS

Figure 1:
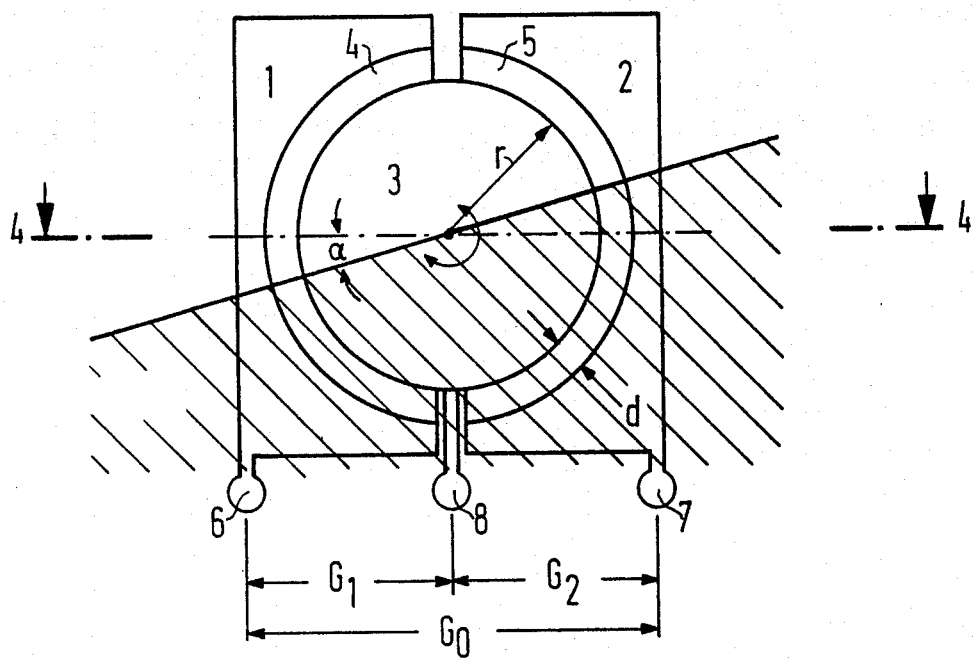
FIG. 1 illustrates a preferred embodiment of the conductance potentiometer of the present invention of the version comprising a circular ring-shaped photoconductor layer.

In FIG. 1, two exterior electrodes 1 and 2 form the rectangular halves of a square separated from one another. A circular surface-shaped tapping electrode 3 with a smaller diameter r lies concentrically within this circle. Between this tapping electrode 3 and the essentially semicircular interior delimitations of the exterior electrodes 1 and 2 lie two essentially semicircular ring-shaped photoconductor layers 4 and 5 having a ring width d. The exterior electrodes 1 and 2 have exterior connecting points 6 and 7; the tapping electrode 3 is connected to an exterior connecting point 8.

A section 4—4 is drawn horizontally relative to the diametral line which separates the exterior electrodes 1 and 2. A diametral exposure line is drawn in a rotary angle α relative to this section 4—4 line, the exposure line divides the essentially circular ring-shaped photoconductor layer 4+5, except for the interruption, into an exposed half and into an unexposed half. The unexposed half of the total arrangement is marked with slash lines. The electric conductance G1 which exists between the exterior connecting point 6 and tapping connecting point 8, and the electric conductance G2 exists between the exterior connecting point 7 and the tapping connecting point 8. The electric conductance G0 lies between the exterior connecting points 6 and 7.

Figure 2:
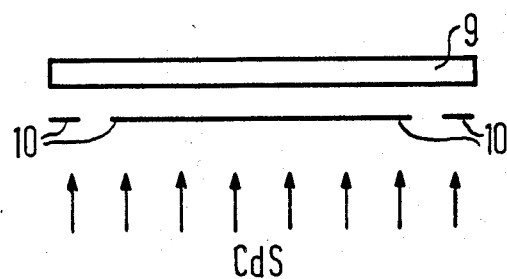
FIGS. 2 through 4 illustrate the sequence of method steps in the production of the potentiometer shown in FIG. 1 with the aid of three sections 4—4 thereof.
Figure 3:
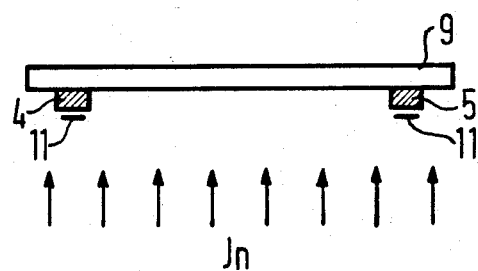
Figure 4:
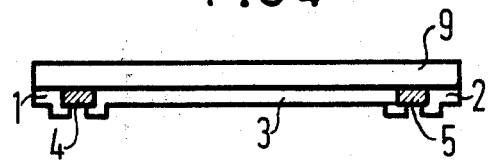

FIGS. 2 through 4 illustrate three sections 4—4 from FIG. 1, with the aid of which, method steps are explained for the production of a conductance potentiometer according to FIG. 1.

In accordance with FIG. 2, the two photoconductor layers 4 and 5 consisting, for example, of $CdS_xSe_{1-x}$ or $Zn_xCd_{1-x}S$, are mounted on a substrate 9, consisting of white or black ceramic or glass, via a mask 10 by means of vapor-deposition, spraying or silk screen printing or other suitable method.

In accordance with FIG. 3, the photoconductive semicircular rings 4 and 5 are covered by a mask 11 and electrode material consisting of, for example, indium, aluminum or gold, is vapor-deposited onto the substrate 9 in a high vacuum, or are mounted according to a different suitable method such as, for example, by means of a slik screen process. Masks 10 and 11 are of metal and are photolithographically produced.

FIG. 4 finally shows a section 4—4 from the completed arrangement according to FIG. 1. Accordingly, the substrate 9 bears two exterior electrodes 1 and 2, two photoconductor layers 4 and 5 and a tapping electrode 3 which connects the two photoconductor layers with one another.

By means of exposing the two photoconductor semicircular rings 4 and 5, as illustrated in FIG. 1, two conductances G1 and G2 are formed between tapping electrode 3, on one hand, and the exterior electrode 1 and 2, on the other hand, which are dependent upon the rotary angle α. Thereby, the following holds true $$G1 = r \cdot \left(\frac{\pi}{2} + \alpha\right) \cdot \frac{\delta}{p \cdot d}$$

$$G2 = r \cdot \left(\frac{\pi}{2} - \alpha\right) \cdot \frac{\delta}{p \cdot d}$$

$$G0 = G1 + G2 = r \cdot \frac{\pi}{2} \cdot \frac{\delta}{p \cdot d}$$

whereby r is approximately the radius of photoconductor layers 4, 5;

α is the rotary angle between the separation line of the exposed part from the unexposed part and the sectional axis 4—4;

δ is the layer thickness of photoconductor layers 4, 5;

ρ is the specific resistance of the photoconductor; and d is the radial width of photoconductor layers 4, 5.

The specific resistance ρ of the photoconductor is provided by exposure φ according to the formula $$\rho = C \cdot \phi^{-\gamma},$$

in which C represents a constant and γ represents the gamma of the photoconductor. C and γ are determined by doping and grid properties of the photoconductor.

Figure 5:
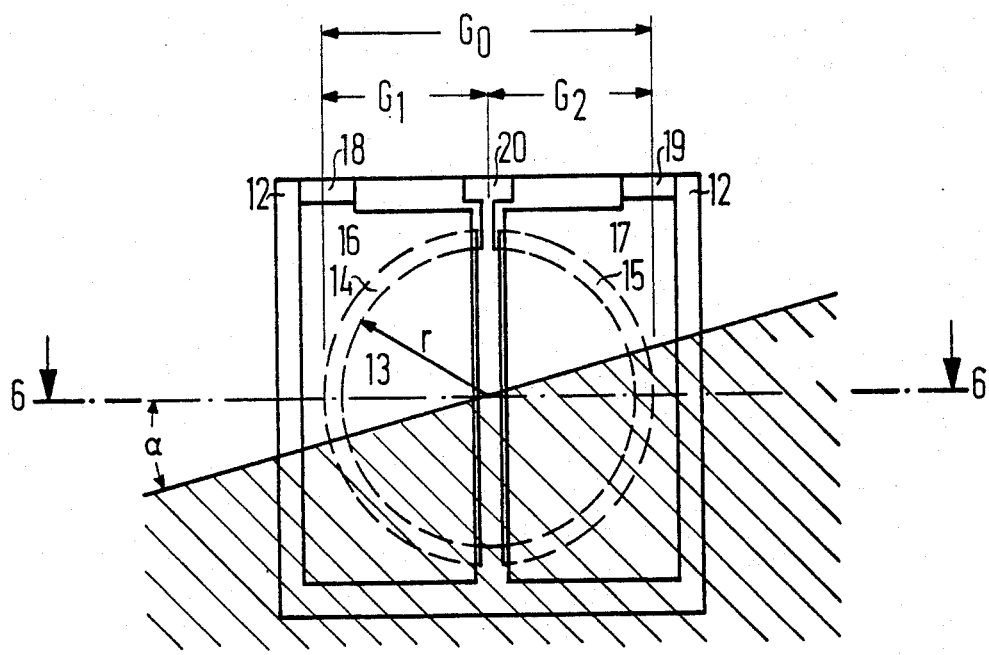
FIG. 5 shows another preferred embodiment of a conductance potentiometer of a version with a circular surface-shaped photoconductor layer.
Figure 6:
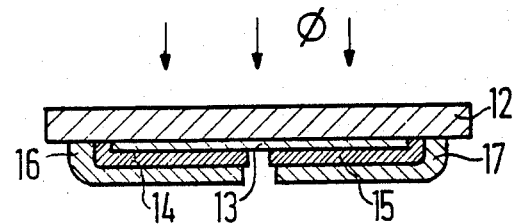
FIG. 6 illustrates a section 6—6 of FIG. 5.

According to FIGS. 5 and 6, the electrodes and the photoconductor layers are mounted in axial direction onto a transparent substrate 12 consisting, for example, of glass. The square substrate 12 firstly bears a circular surface-shaped tapping electrode 13 of transparent material such as, for example, conductive glass of $SnO_2$. Two semicircular surface-shaped layers 14 and 15, separated from one another, are concentrically mounted onto said conductive glass. The two photoconductor layers 14 and 15 are electrically connected respectively via an essentially semicircular surface-shaped contact by means of tapping electrode 13. One exterior electrode 16 or 17 consisting, for example, of indium, is respectively lying on the photoconductor layers 14 and 15. The contact surfaces between photoconductor layers 14 and 15 and exterior electrodes 16 and 17 are again essentially semicircular surfaces, whereby the exterior electrodes 16 and 17 are drawn through to the edge of substrate 12 and there have connecting points 18, 19. Tapping electrode 13 is correspondingly connected to a connecting point 20.

The exposure again proceeds, as according to FIG. 1, horizontally relative to the drawing surface in a semicircular surface concentrically relative to the photoconductor surface, whereby the semicircular surface can be coaxially rotated about angle α. In that case, the exposure proceeds by means of substrate 12, as illustrated in FIG. 6; it shows a section 6—6 diametrally horizontally relative to the separation line of the two exterior electrodes 16 and 17 according to FIG. 5. The partial conductances G1 and G2 again lie between tapping electrode 13 and exterior electrodes 16 and 17. Their magnitude is again linearly determined by rotary angle α, however, is considerably larger than according to FIG. 1, because their circular partial surfaces are determining for the effective portion of the photoconductor and not only parts of circular lines multiplied by layer thickness δ.

The conductances are there computed with $$G1 = \tfrac{1}{2} r^2 \cdot \left(\frac{\pi}{2} + \alpha\right) \cdot \frac{1}{\rho \cdot d}$$

$$G2 = \tfrac{1}{2} r^2 \cdot \left(\frac{\pi}{2} - \alpha\right) \cdot \frac{1}{\rho \cdot \delta}$$

-continued
$$G0 = G1 + G2 = \tfrac{1}{2}r^2 \cdot \frac{1}{\rho \cdot \delta}$$

Figure 7:
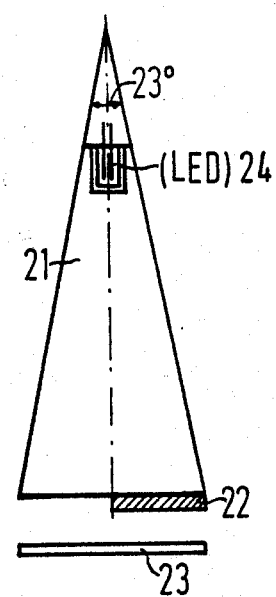
FIG. 7 shows the arrangement of a cone-shaped photoconductor for exposing the photoconductor layer.

FIG. 7 schematically illustrates the exposure device. A cone 21 consisting of acrylic glass has an apex angle of ≦23° and a circular base surface covered by a semi-circular-shaped diaphragm 22. Photoconductor arrangement 23 to be exposed is situated therebelow. A luminous diode 24 is inserted in the tip of cone 21 which illuminates the base of cone 21. Cone 21 can be rotated about its axis against photoconductor arrangement 23. The light of the luminous diode 24 is totally reflected at the cone-shaped shell surface so that it is almost completely utilized for the exposure of photoconductor arrangement 23, aside from the bisection by diaphragm 22. A modification consists thereof, which may be obtained by leaving cone 21 fixed and only rotating diaphragm 22.

It will be apparent to those skilled in the art that many modifications and variations may be effected without departing from the spirit and scope of the novel concepts of the present invention.

We claim as our invention:

1. A contactless conductance potentiometer wherein the total conductance between two electrical terminals can be selectively divided into parts, which parts always equal the said total conductance comprising a light transparent substrate, a circular light transparent tapping electrode formed on said substrate, an external terminal connected to said tapping electrode, a pair of semicircular shaped photoconductor layers formed on substrate about and overlying and contacting said circular tapping electrode and electrically separated from each other, a pair of exterior electrodes formed on said substrate and overlying and respectively contacting said pair of semicircular photoconductor layers and said pair of exterior electrodes electrically separated from each other, such that when said pair of photoconductor layers are exposed to light through said transparent substrate and tapping electrode on approximately half of the total circular area of said semicircular photoconductor layers, the conductance of said two parts being equal to the total conductance between said two terminals, the tapping point being determined by the angular position of light falling on half of said pair of photoconductor layers.

2. A potentiometer according to claim 1, characterized in that the exposure of said pair of photoconductor layers takes place by means of a cone-shaped photoconductor which can be coaxially rotated relative to said pair of photoconductor layers, said photoconductor having the light source in its tip, and whose circular base surface is light-impermeable in one diametral half.

3. A potentiometer according to claim 1, in which means for exposing said pair of photoconductor layers is provided by a cone-shaped photoconductor coaxially arranged relative to said pair of photoconductor layers, said photoconductor having a light source located in its tip, and a coaxially rotatable diaphragm between said photoconductor and said photoconductor layers which determines the half of the photoconductor layers to be exposed.

4. A potentiometer according to claim 2, characterized in that the cone consists of acrylic glass and that its apex angle is equal to or smaller than 23°.

5. A potentiometer according to claim 3, characterized in that the cone consists of acrylic glass and that its apex angle is equal to or smaller than 23°.

6. A contactless conductance potentiometer wherein the total conductance between two electric terminals can be selectively divided into two parts, which two parts always equal the said total conductance, comprising a substrate, a ring-shaped photoconductor on one surface of said substrate divided diametrally into two similar coplanar parts, first and second outer electrodes on said substrate surface, each partially surrounding respectively said photoconductor parts, a tapping electrode lying on said substrate surface within said two parts of said ring-shaped photoconductor, said ring-shaped parts being marginally in contact with said two outer electrodes and the outer marginal edge of said tapping electrode being marginally in contact with the inner marginal edges of said photoconductor parts, whereby when said photoconductors are exposed to light on approximately half of the total circular area of said ring-shaped photoconductors, the conductance of said two parts being equal to the total conductance between said two terminals, the tapping point being determined by the angular position of light falling on half of said ring-shaped photoconductor, said tapping electrode having an exterior terminal.

7. A potentiometer according to claim 6, characterized in that exposure of said two parts of said ring-shaped photoconductor takes place by means of a cone-shaped photoconductor which can be coaxially rotated relative to said two parts of said ring-shaped photoconductor, said cone-shaped photoconductor having a light source in its tip and whose circular base surface is light-impermeable in one diametral half.

8. A potentiometer according to claim 6 in which means for exposing said two parts of said ring-shaped photoconductor is provided by a cone-shaped photoconductor coaxially arranged relative to said two parts of said photoconductor, said cone-shaped photoconductor having a light source located in its tip and a coaxially rotatable diaphragm between said cone-shaped photoconductor and said two photoconductor parts of said ring-shaped photoconductor which determines the half of the photoconductor layers to be exposed.

9. A potentiometer according to claim 7, characterized in that the cone consists of acrylic glass and that its apex angle is equal to or smaller than 23°.

10. A potentiometer according to claim 8, characterized in that the cone consists of acrylic glass and that its apex angle is equal to or smaller than 23°.

* * * * *